(12) United States Patent
Sunagawa et al.

(10) Patent No.: US 6,613,180 B2
(45) Date of Patent: Sep. 2, 2003

(54) METHOD FOR FABRICATING SEMICONDUCTOR-MOUNTING BODY AND APPARATUS FOR FABRICATING SEMICONDUCTOR-MOUNTING BODY

(75) Inventors: Yoshitaka Sunagawa, Neyagawa (JP);
Yoshitake Hayashi, Kawachinagano (JP); Masayoshi Koyama, Tondabayashi (JP); Yoshihiro Tomura, Hirakata (JP); Toshiyuki Kojima, Moriguchi (JP); Osamu Shibata, Osaka (JP); Ryuichi Saito, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/114,089

(22) Filed: Apr. 1, 2002

(65) Prior Publication Data

US 2003/0027371 A1 Feb. 6, 2003

(30) Foreign Application Priority Data

Aug. 3, 2001 (JP) ............................ 2001-236828

(51) Int. Cl.$^7$ ............................... B32B 31/00
(52) U.S. Cl. .................. 156/285; 156/582; 156/297
(58) Field of Search ................ 156/285, 582, 156/297, 299, 580, 581, 286, 583.1; 264/511, 276, 272.17, 272.14, 266; 425/116, 117, 121, 534, 544; 438/118, 127, 108

(56) References Cited

U.S. PATENT DOCUMENTS

| 5,001,542 | A | * | 3/1991 | Tsukagoshi et al. | 257/746 |
|---|---|---|---|---|---|
| 5,170,930 | A | * | 12/1992 | Dolbear et al. | 228/123.1 |
| 5,230,759 | A | * | 7/1993 | Hiraiwa | 156/69 |
| 5,611,655 | A | * | 3/1997 | Fukasawa et al. | 414/217 |
| 5,759,873 | A | * | 6/1998 | Kata et al. | 438/118 |
| 5,961,768 | A | * | 10/1999 | Tsujimoto | 156/285 |
| 5,988,481 | A | * | 11/1999 | Torihata et al. | 228/49.5 |
| 6,126,885 | A | * | 10/2000 | Oida et al. | 264/511 |
| 6,137,183 | A | * | 10/2000 | Sako | 257/783 |
| 6,228,688 | B1 | * | 5/2001 | Ohta et al. | 438/127 |
| 6,258,314 | B1 | * | 7/2001 | Oida et al. | 264/511 |

FOREIGN PATENT DOCUMENTS

| EP | 1 139 410 | | 10/2001 | | |
|---|---|---|---|---|---|
| JP | 57021828 | A | * | 2/1982 | ........ H01L/21/56 |
| JP | 04309265 | A | * | 10/1992 | ........ H01L/27/14 |
| JP | 05082670 | A | * | 4/1993 | ........ H01L/23/24 |
| JP | 2001-308510 | | | 10/2001 | |

* cited by examiner

*Primary Examiner*—Carl Whitehead, Jr.
*Assistant Examiner*—Laura M Schillinger
(74) *Attorney, Agent, or Firm*—RatnerPrestia

(57) ABSTRACT

A method for fabricating a semiconductor-mounting body having at least one semiconductor device mounted on a substrate and a sealing resin set in the gap between the substrate and the semiconductor device, has a first step of setting a flexibly deformable sheet on a face of the semiconductor device not facing the substrate; and a second step of generating an air-pressure difference between the side where the semiconductor device is not present and the side where the semiconductor device is present on the basis of the sheet so that the air pressure at the side where the semiconductor device is not present becomes higher than the side where the semiconductor device is present and pressurizing the semiconductor device by the sheet after the first step.

16 Claims, 15 Drawing Sheets

METHOD FOR FABRICATING SEMICONDUCTOR-MOUNTING BODY AND APPARATUS FOR FABRICATING SEMICONDUCTOR-MOUNTING BODY

BACKGROUND OF THE INVENTION

1. Field of the Invention

The present invention relates to a method for fabricating a semiconductor-mounting body comprising a semiconductor device mounted on a substrate and an apparatus for fabricating a semiconductor-mounting body.

2. Related Art of the Invention

As the fining art of a semiconductor process advances, the form of a semiconductor package is also developed from QFP to μ BGA and CSP (chip size package), and moreover flip-chip mounting of directly connecting a semiconductor bare chip onto a substrate.

Above all, in the case of the flip-chip mounting, because a semiconductor device and a substrate are directly mounted, application development to units requiring a high-speed processing may be further accelerated. To realize the above mounting art, a mounting-process art is indispensable and a fabrication equipment and a process art for joining a semiconductor device with a substrate so that the reliability can be secured in a short time are particularly important.

A case of performing mounting by using the flip-chip mounting art is described below by referring to the accompanying drawings. FIG. 10 is an illustration for explaining the configuration of a structure in which a semiconductor device is flip-chip-mounted on a substrate by using a conventional apparatus for fabricating a semiconductor-mounting body and its fabrication procedure and FIG. 11 is a schematic view for performing flip-chip mounting by setting an elastic body to a position where a heat source contacts a semiconductor device. In FIGS. 10 and 11, the same portions are provided with the same symbol.

As shown in FIG. 10, a bump 16 having a two-stage protrusion shape is formed on an electrode pad 15 of a semiconductor device 2 by melting an Au wire and then, a conductive adhesive 17 is transferred to the two-stage protruded portion of the bump 16. Then, the semiconductor device 2 is faced down and joined with a terminal electrode 18 pattern-formed on a substrate 1 to cure the conductive adhesive 17.

Then, a liquid epoxy-based sealing resin 11 is injected into the gap between the semiconductor device 2 and the substrate 1 and then, as shown in FIG. 11, an elastic body 22 is set to the position with which a heat source 7 and semiconductor device 2 contact to cure the sealing resin 11 while pressing the back of the semiconductor device 2 by the elastic body 22.

A base table 21 is a table to which the substrate 1 is set. Thus, by curing the sealing resin 11 while pressing the semiconductor device 2 at a load larger than the pushing-up force of the semiconductor device 2 due to the thermal expansion when the searing resin 11 is heated, it is possible to minimize increase of a connection resistance or imperfect joining states.

However, there may be no problem about the case in which the substrate 1 is thick and has a thermal expansion coefficient close to that of the semiconductor device 2 and a small number of semiconductor devices 2 are flip-chip-mounted like the case of the conventional configuration shown in FIG. 10. As shown in FIG. 11, however, when flip-chip-mounting the semiconductor devices 2 different from each other in thickness and shape on the substrate 1, stresses are concentrated on the highest semiconductor device 2 and the highest semiconductor device 2 is greatly damaged, because pressure is inevitably applied from the thickest semiconductor device 2 to lower ones in order.

Even if using a method for absorbing fluctuations in heights of the semiconductor devices 2 by cushions such as elastic bodies 22A, 22B, and 22C at the position where the heat source 7 contacts the semiconductor devices 2, it is difficult to apply a uniform pressure to the elastic bodies 22A and 22C other than the elastic body 22B because stresses are further concentrated on the elastic body 22B as the thickness fluctuation of the semiconductor devices 2 increases.

Moreover, a position shift may occur in the semiconductor devices 2 due to the elastic deformation of the elastic body 22B.

Furthermore, when many semiconductor devices 2 having different thicknesses and shapes are present on the substrate 1, it is necessary to set the above elastic bodies to positions corresponding to all the semiconductor devices 2. Therefore, a fabrication system is inevitably restricted to a dedicated system for only one type of product. Therefore, in the case of many types of products, it is necessary to use an elastic body for each type of produce each time and thus, there is a problem in versatility.

Therefore, it is difficult to flip-chip-mount many semiconductor devices having different thicknesses and shapes by the conventional fabrication method.

SUMMARY OF THE INVENTION

The present invention is made to solve the above conventional problems and its object is to provide a method for fabricating a semiconductor-mounting body and an apparatus for fabricating a semiconductor-mounting body capable of fabricating a semiconductor-mounting body by substantially uniformly pressurizing a plurality of semiconductor devices having different thicknesses and shapes when mounted on a substrate.

One aspect of the present invention is a method for fabricating a semiconductor-mounting body having at least one semiconductor device mounted on a substrate and a sealing resin set in the gap between the substrate and the semiconductor device, comprising:

a first step of setting a flexibly deformable sheet on a face of the semiconductor device not facing the substrate; and a second step of generating an air-pressure difference between the side where the semiconductor device is not present and the side where the semiconductor device is present on the basis of the sheet so that the air pressure at the side where the semiconductor device is not present becomes higher than the side where the semiconductor device is present and pressurizing the semiconductor device by the sheet after the first step.

Another aspect of the present invention is the method for fabricating a semiconductor-mounting body, wherein at least a part of the sheet does not contact the substrate in the second step.

Still another aspect of the present invention is the method for fabricating a semiconductor-mounting body, wherein the second step is executed by supplying predetermined gas to the side of the sheet where the semiconductor device is not present and excluding gas from the side where the semiconductor device is present.

Yet still another aspect of the present invention is the method for fabricating a semiconductor-mounting, wherein the sheet does not contact the semiconductor device and/or the sealing resin at least immediately before the pressurization is performed.

Still yet another aspect of the present invention is the method for fabricating a semiconductor-mounting, further comprising a third step of fixing the circumference of the sheet set on the semiconductor device at least immediately before pressurizing the sheet.

A further aspect of the present invention is the method for fabricating a semiconductor-mounting body, wherein looseness is removed from the sheet before pressurizing the sheet.

A still further aspect of the present invention is the method for fabricating a semiconductor-mounting body, wherein looseness is removed from the sheet by fixing the circumference of the sheet from the outside to the inside of the sheet in order.

A yet further aspect of the present invention is the method for fabricating a semiconductor-mounting body, further comprising a fourth step of heating the sheet by a heater from the side where the semiconductor device is not present when pressurizing the sheet.

A still yet further aspect of the present invention is the method for fabricating a semiconductor-mounting body, wherein the distance between the set sheet and the heater is adjusted.

An additional aspect of the present invention is the method for fabricating a semiconductor-mounting body, wherein the sheet is a rubber sheet formed by silicon or Buna-S and having a thickness of 0.01 to 3 mm.

A still additional aspect of the present invention is the method for fabricating a semiconductor-mounting s, wherein the sheet is a resin sheet formed by any one of polyimide, fluoro resin, polyphenylene sulfide, polypropylene, polyether, polycarbonate, and chrolosulfonated polyethylene, or a compound of them and having a thickness of 0.01 to 1 mm.

A yet additional aspect of the present invention is the method for fabricating a semiconductor-mounting body, wherein the sheet is a metallic sheet formed by aluminum, copper, or stainless steel and having a thickness of 0.01 to 0.5 mm.

A still yet additional aspect of the present invention is the method for fabricating a semiconductor-mounting, wherein a mold-releasing treatment is applied to the face of the sheet contacting the semiconductor device.

A supplementary aspect of the present invention is the method for fabricating a semiconductor-mounting body, wherein a coloring treatment for improving heat absorption is applied to the face of the sheet not contacting the semiconductor device.

A still supplementary aspect of the present invention is the method for fabricating a semiconductor-mounting, wherein a colored additive for improving heat absorption is contained in the sheet.

A yet supplementary aspect of the present invention is the method for fabricating a semiconductor-mounting body, further comprising a fifth step of setting a support frame for supporting the sheet nearby the semiconductor device before setting the sheet.

A still yet supplementary aspect of the present invention is an apparatus for fabricating a semiconductor-mounting body having at least one[] semiconductor device mounted on a substrate and a sealing resin set in the gap between the substrate and the semiconductor device, comprising:

setting means of setting a flexibly deformable sheet on a face of the semiconductor device not facing the substrate; and pressurizing means of generating an air-pressure difference between the side where the semiconductor device is not present and the side where the semiconductor device is present so that the air pressure at the side where the semiconductor device is not present becomes higher than the side where the semiconductor device is present on the basis of the sheet and pressurizing the semiconductor device by the sheet.

One aspect of the present invention is the apparatus for fabricating a semiconductor-mounting body, wherein at least a part of the sheet does not contact the substrate when the pressurization is performed.

Another aspect of the present invention is the apparatus for fabricating a semiconductor-mounting body, wherein the pressurizing means supplies predetermined gas to the face of the sheet where the semiconductor device is not present and excludes gas from the side where the semiconductor device is present.

Still another aspect of the present invention is the apparatus for fabricating a semiconductor-mounting body, wherein the sheet does not contact the semiconductor device and/or the sealing resin at least immediately before the pressurization is performed.

Yet still another aspect of the present invention is the apparatus for fabricating a semiconductor-mounting body, further comprising fixing means of fixing the circumference of the sheet set to the semiconductor device at least immediately before the sheet is pressurized.

Still yet another aspect of the present invention is the apparatus for fabricating a semiconductor-mounting, further comprising looseness removing means of removing looseness from the sheet before pressurizing the sheet.

A further aspect of the present invention is the apparatus for fabricating a semiconductor-mounting body, wherein looseness is removed from the sheet by fixing the circumference of the sheet from the outside to the inside of the sheet in order.

A still further aspect of the present invention is the apparatus for fabricating a semiconductor-mounting, further comprising heating means of heating the sheet from the side where the semiconductor device is not present when the sheet is pressurized.

A yet further aspect of the present invention is the apparatus for fabricating a semiconductor-mounting, further comprising distance adjusting means of adjusting the distance between the set sheet and the heating means.

A still yet further aspect of the present invention is the apparatus for fabricating a semiconductor-mounting body according to 17 th or 18 th inventions, wherein the sheet is a rubber sheet formed by silicon or Buna-S and having a thickness of 0.01 to 3 mm.

An additional aspect of the present invention is the apparatus for fabricating a semiconductor-mounting body, wherein the sheet is a resin sheet formed by any one of polyimide, fluoro resin, polyphenylene sulfide, polypropylene, polyether. polycarbonate, and chrolosulfonated polyethylene, or a compound of them and having a thickness of 0.01 to 1 mm.

A still additional aspect of the present invention is the apparatus for fabricating a semiconductor-mounting, wherein the sheet is a metallic sheet formed by aluminum, copper, or stainless steel and having a thickness of 0.01 to 0.5 mm.

A yet additional aspect of the present invention is the apparatus for fabricating a semiconductor-mounting, wherein a mold-releasing treatment is applied to the face of the sheet contacting the semiconductor device.

A still yet additional aspect of the present invention is the apparatus for fabricating a semiconductor-mounting, wherein a coloring treatment for improving heat absorption is applied to the face of the sheet not contacting the semiconductor device.

A supplementary aspect of the present invention is the apparatus for fabricating a semiconductor-mounting, wherein a colored additive for improving heat absorption is contained in the sheet.

A still supplementary aspect of the present invention is an apparatus for fabricating a semiconductor-mounting body, further comprising a support frame to be set to support the sheet nearby the semiconductor device before the sheet is set. conductor device, comprising:

Description of Symbols

Figure 1:
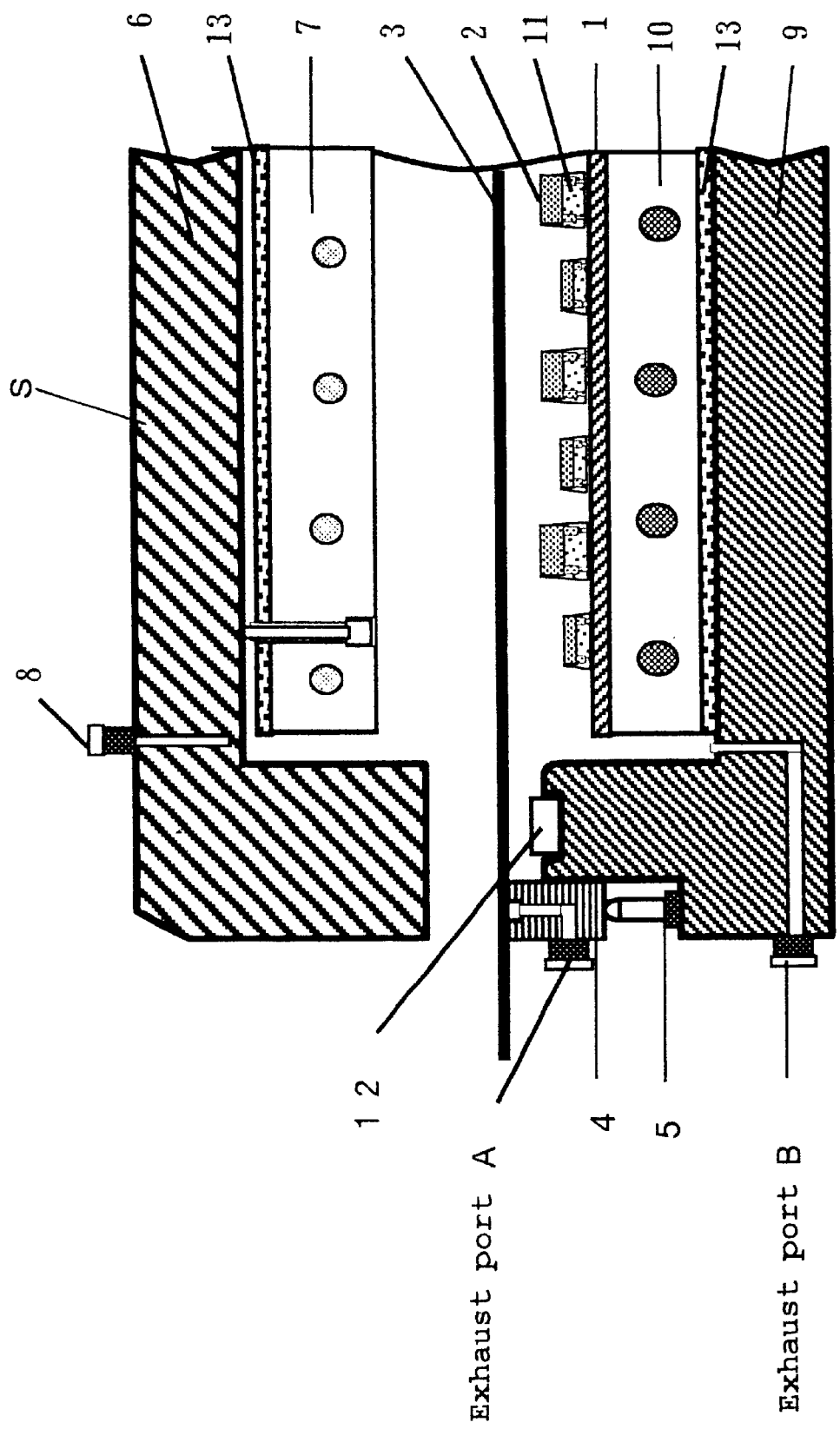
FIG. 1 is a sectional view of the apparatus for fabricating a semiconductor-mounting body of the first and fourth embodiments of the present invention.

1 ... substrate
2 ... Semiconductor device
3 ... Sheet material
4 ... Attracting mechanism
5 ... Vertically moving mechanism
6 ... Upper chamber
7, 10 ... Heat source
8 ... Pressurizing port
9 ... Lower chamber
11 ... Sealing resin
12 ... Sealing elastic body
13 ... Adiabatic plate

PREFERRED EMBODIMENTS OF THE INVENTION

Embodiments of the present invention will be described below by referring to the accompanying drawings.

First Embodiment

First, first embodiment of the present invention is described below by referring to the accompanying drawings.

Figure 2:
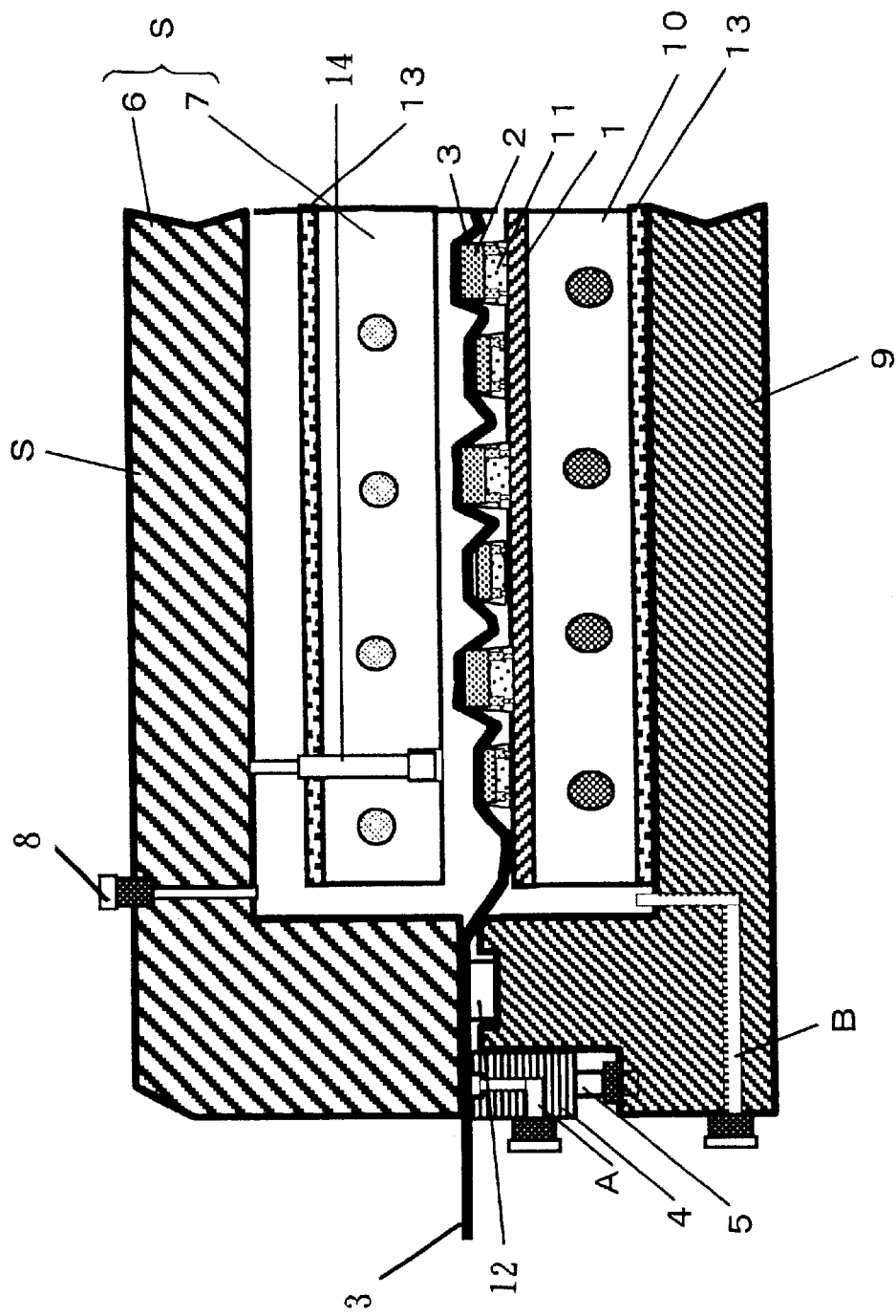
FIG. 2 is an illustration for explaining the method for fabricating a semiconductor-mounting body of the first and fourth embodiments of the present invention.

FIG. 1 is an illustration showing a configuration of the apparatus for fabricating a semiconductor-mounting body of the first embodiment of the present invention and for explaining a general configuration of a mounting body in which a semiconductor device is flip-chip-mounted on a substrate and FIG. 2 is a detailed illustration of FIG. 1.

Semiconductor-mounting-body fabrication method and fabrication system of the first embodiment are described below by referring to FIGS. 1 and 2.

As shown in FIGS. 1 and 2, an attracting mechanism 4 in which a concave groove is formed on a frame and a vertically moving mechanism 5 for moving a flexibly deformable sheet material 3 up to the vicinity of the back of the semiconductor devices 2 are set to the lower face of the sheet material 3 set on the upper face of a plurality of semiconductor devices 2 flip-chip-mounted on a substrate 1. The vertically moving mechanism 5 is constituted by an elastic body such as a spring. An integrated structure S in which a heat source 7 is built in a upper chamber 6 is set over the sheet material 3 and a pressurizing port 8 is formed on a part of the upper chamber 6. Moreover, in FIGS. 1 and 2, it is assumed that a sealing resin 11 is set in the gap between the substrate 1 and each semiconductor device 2. The sealing resin 11 can use a paste-like or sheet-like resin.

In the case of the apparatus for fabricating a semiconductor-mounting body thus constituted, when lowering the integrated structure S toward the sheet material 3 and mounting the upper chamber 6 on the attracting mechanism 4, the attracting mechanism 4 is lowered by the vertically moving mechanism 5 due to the weight of the upper chamber 6, the circumference of the sheet material 3 is fixed, and the sheet material 3 is set to the upper face of each semiconductor device 2. Then, by supplying air or compressed gas from the pressurizing port 8 into the upper chamber 6, air pressure is transferred to the sheet material 3 and the semiconductor devices 2 are pressed by uniform pressure.

Then, by making the heat source 7 approach to the sheet material 3, radiant heat of the heat source 7 is transferred to the sealing resin 11 through the sheet material 3. Therefore, it is possible to substantially uniformly pressurize many semiconductor devices 2 having different thicknesses and shapes. As a result, it is possible to simultaneously realize pressurizing and heating treatments in a short time.

Figure 13:
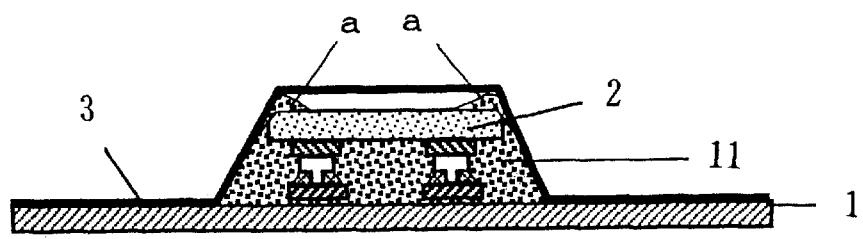
FIG. 13 is an illustration (1) of the creeping-up phenomenon of the sealing resin 11 of the first embodiment of the present invention.

As shown in FIG. 13, if the hardness of the sheet material 3 is very low and the thickness of it is very smaller when supplying air pressure to the sheet material 3, the tensile elastic modulus is inevitably lowered. Then, the sealing resin 11 injected to the back of the semiconductor device 2 is sealed by the sheet material 3, a phenomenon that the sealing resin 11 creeps up to the upper face of the semiconductor device 2 occurs as shown by the portion "a" due to the internal stress of the sheet material 3 and appearance of the semiconductor device 2 is damaged and qualities of them are deteriorated. Moreover, when CSP (chip-size-package)-mounting the semiconductor device 2 on a mother board, if the sealing resin 11 attaches the surface of the semiconductor device 2, an attraction error of a mounting unit occurs and this becomes a large problem in performing mounting.

Figure 14:
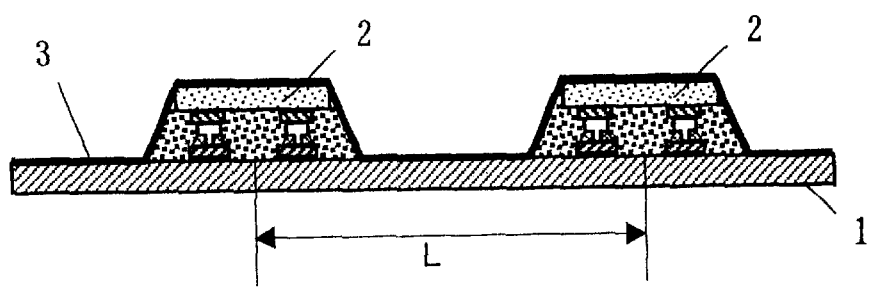
FIG. 14 is an illustration (2) of the creeping-up phenomenon of the sealing resin 11 of the first embodiment of the present invention.
Figure 15:
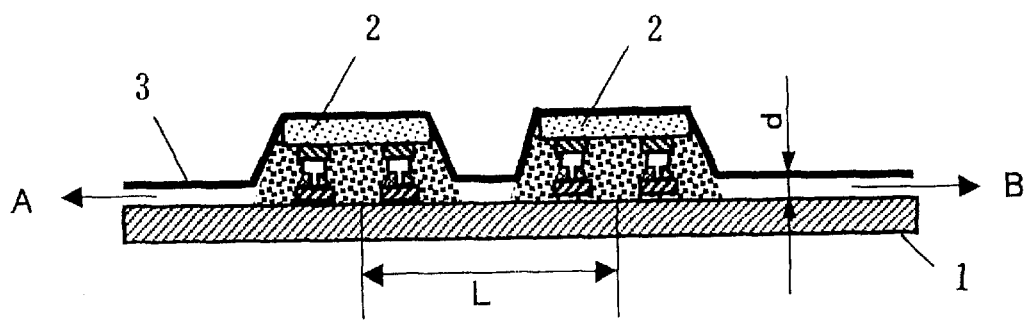
FIG. 15 is an illustration (1) of the state in which the sheet material 3 of the first embodiment of the present invention does not contact the substrate 1.

Moreover, as shown in FIG. 14, when the distance L between adjacent semiconductor devices 2 increases, the sheet material 3 is brought into closer contact with the face of the substrate 1. Therefore, the phenomenon same as the above described occurs.

Therefore, to suppress the occurrence of the above phenomenon, a hardness, a thickness, and a tensile elastic modulus for preventing the sheet material 3 from contacting the face of the substrate 1 are provided for the sheet material 3 and the distance L between the semiconductor devices 2 is prevented from excessively increasing. Then, a leak path is formed in directions A and B due to the gap d formed between the sheet material 3 and the substrate 1 and thus, a part of the sheet material 3 does not contact the substrate 1. Therefore, it is possible to minimize influences of the sealing resin 11 attaching to the surface of the semiconductor device 2 and improve the quality.

Figure 16:
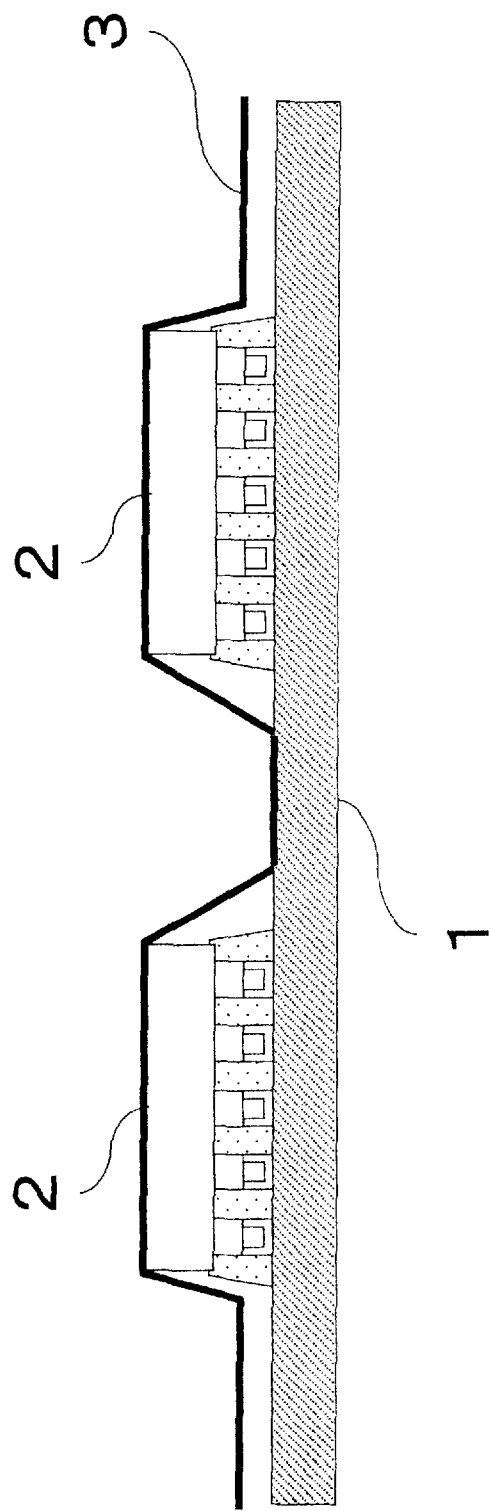
FIG. 16 is an illustration (2) of the state in which the sheet material 3 of the first embodiment of the present invention does not contact the substrate 1.

Even if a part of the sheet material 3 contacts the substrate 1 as shown in FIG. 16, this is accepted unless another part of the material 3 (which doesn't contact the semiconductor device 2, of course) contacts the substrate 1.

It is also possible to prevent the sheet material 3 from contacting the semiconductor device 2 and/or the sealing resin 11 at least immediately before the pressurization is performed by adjusting the timing for supplying air pressure.

Moreover, a heat source 10 constituted on a lower chamber 9 is used to perform preheating of the substrate 1 and heating of the sealing resin 11 for improving the injection characteristic of the sealing resin 11, an exhaust port A is used to attract the sheet material 3, an exhaust port B is used to generate a pressure difference between upper and lower portions of the sheet material 3, and a sealing elastic body 12 serves as a sealing material for preventing leakage from upper and lower portions of the sheet material 3. An adiabatic plate 13 is an adiabatic material for thermal shield and a height-control screw 14 is used to adjust heights of the heat source 7 and the semiconductor device 2.

Moreover, the sheet material 3 uses a rubber sheet material formed by silicon or Buna-S at a thickness of 0.01 to 3 mm, a resin sheet material formed by one of polyimide, fluoro resin, polyphenylene sulfide, polypropylene, polyether, polycarbonate, and chrolosulfonated polyethylene at a thickness of 0.01 to 1 mm, or a metallic sheet material formed by aluminum, copper, or stainless steel at a thickness of 0.01 to 0.5 mm. Moreover, it is allowed to use a material capable of efficiently absorbing radiant heat as the sheet material 3.

Moreover, it is allowed that the sheet material 3 uses a sheet formed by a rubber sheet material such as the above silicon or Buna-S, a resin sheet material such as polyimide, fluoro resin, polyphenylene sulfide, polypropylene, polyether, polycarbonate, or chrolosulfonated polyethylene, or a compound material of metallic sheet materials such as aluminum, copper, and stainless steel.

Furthermore, by applying a mold-releasing treatment to the side of the sheet material 3 contacting the semiconductor device 2, it is possible to suppress attachment of the sealing resin 11 and the operation efficiency is improved even if the sealing resin 11 is attached because cleaning of the resin 11 is simplified.

Furthermore, by applying a coloring treatment for improving heat absorption to the side of the sheet material 3 not contacting the semiconductor device 2, a quick heat absorption characteristic is obtained and the sealing resin 11 can be thermally cured in a short time.

Furthermore, by adding a colored additive to the sheet material 3, the advantage same as the above can be obtained.

Furthermore, by applying the above mold-releasing treatment and coloring treatment to a compound constituted by a rubber sheet material, a resin sheet material, and a metallic sheet material, etc. (for example, a combination of a silicon rubber sheet material with a metallic sheet material), it is possible to suppress the damage that the sheet material 3 contacts the semiconductor device 2 and prevent the sealing resin 11 from attaching to the sheet material 3 by silicon rubber serving as an elastic body, and to improve the heat absorption characteristic of the sheet material 3 by a metallic sheet material superior in heat transfer.

Furthermore, by using a vertically moving mechanism in which a plurality of concave grooves are formed and thereby, successively attracting the sheet material 3 to the semiconductor device 2 from the outside of the sheet material 3, the looseness of the sheet material 3 is corrected and a stable stretch can be obtained.

Figure 17:
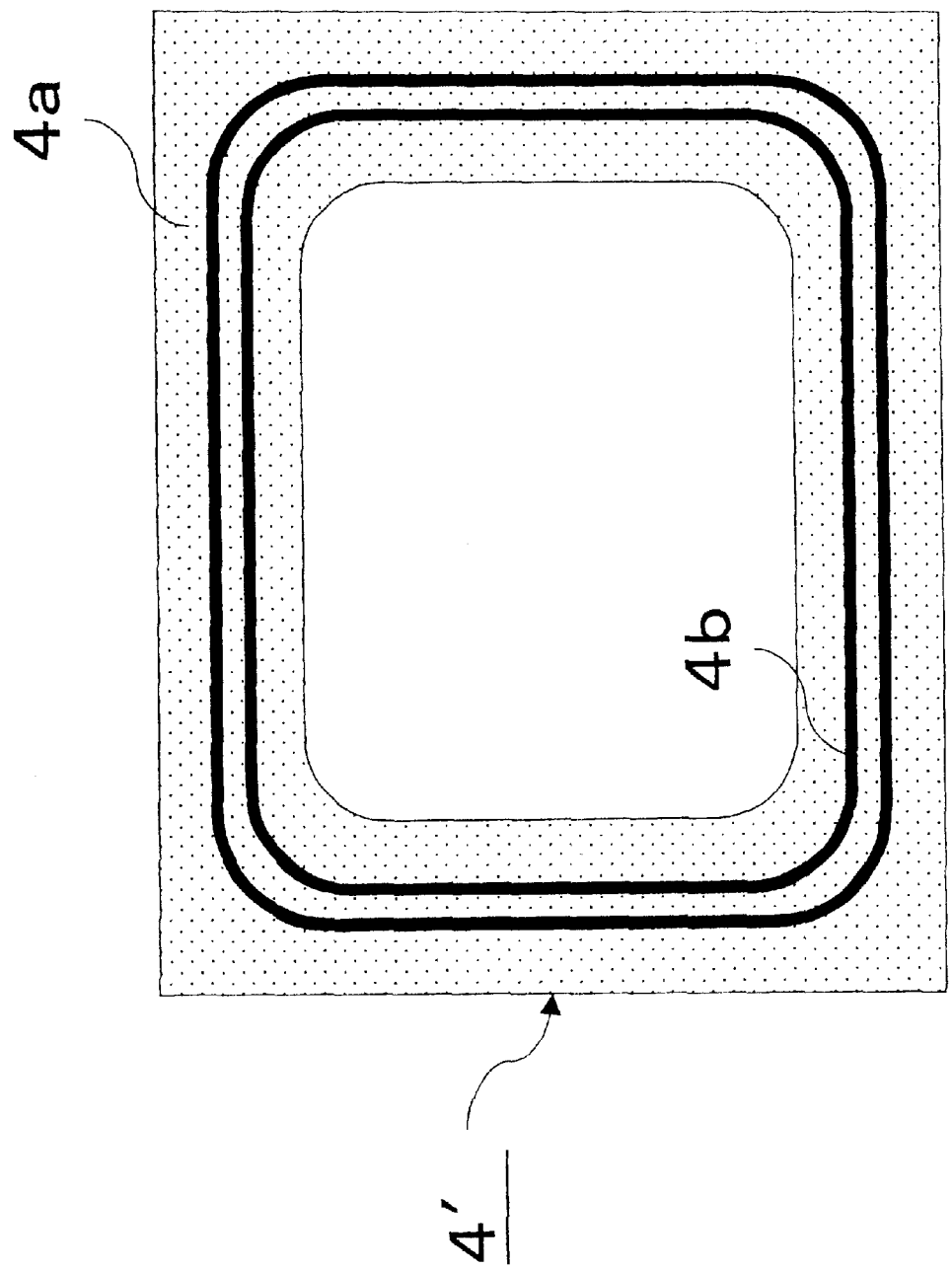
FIG. 17 is an illustration of the attracting mechanism 4' having the grooves 4a and 4b of the first embodiment of the present invention.
Figure 18:
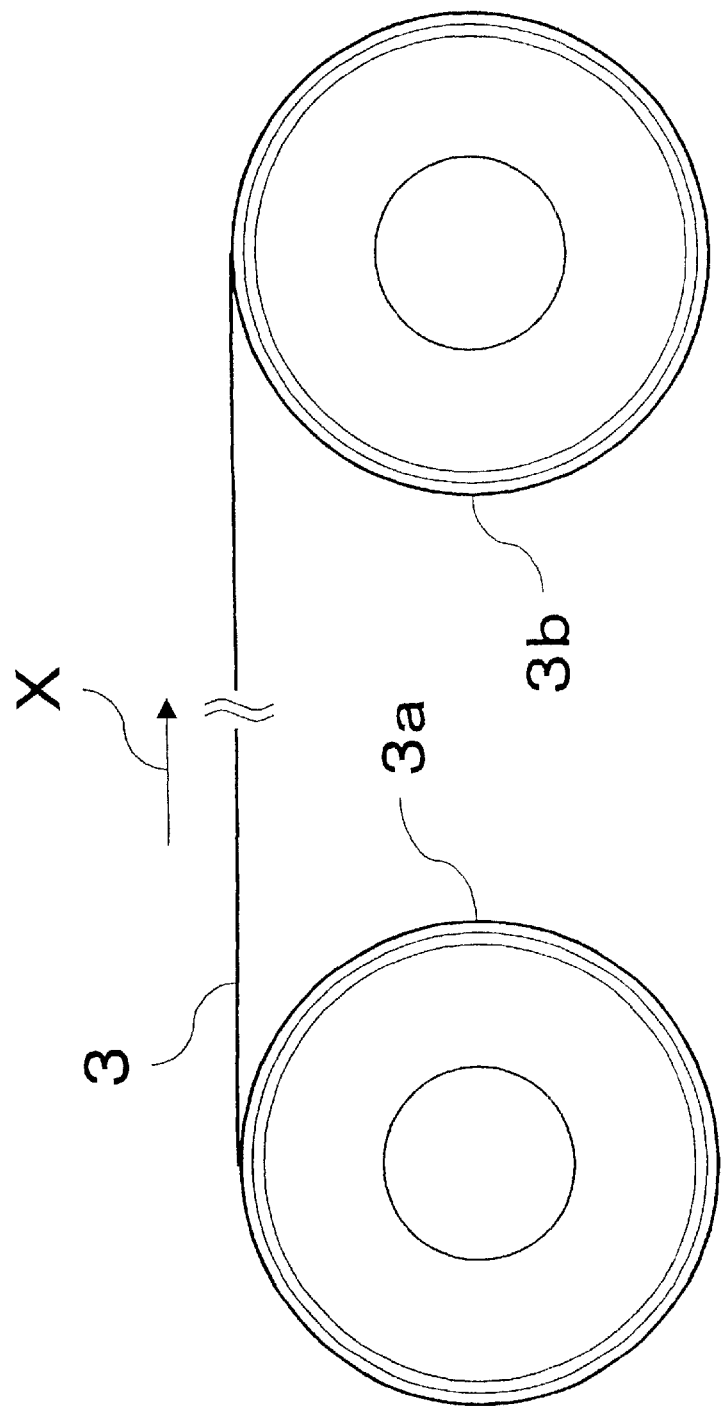
FIG. 18 is an illustration of the feed reel 3a and the winding reel 3b of the first embodiment of the present invention.

More specifically, as shown in FIG. 17, it is allowed to fix the circumference of the sheet material 3 from the outside to the inside of the sheet material 3 in order by (1) first using a groove 4a formed at the outside of an attracting mechanism 4' and thereby attracting the sheet material 3 and then (2) using a groove 4b formed at the inside of the attracting mechanism 4' and thereby attracting the sheet material 3 and remove looseness from the sheet material 3 by generating a tension. Because four corners of the groove 4a and 4b are rounded, the sheet material 3 is attracted without causing unnecessary creases.

Moreover, it is allowed to stretch the sheet material 3 by a method other than vacuum attraction. For example, it is allowed to motor-drive a feed reel 3a for feeding the sheet material 3 in the direction of an arrow X and a winding reel 3b for winding the sheet material 3 around it and control the sheet material at a certain stretch. Furthermore, it is possible to provide a stable stretch for the sheet material 3 by setting a tension gauge around the feed reel 3a and the winding reel 3b to read the output value of the tension gauge for controlling.

Furthermore, by decompressing the lower chamber 9 through the exhaust port B, the sheet material 3 set on the upper face of the lower chamber 9 is attracted. In this case, because pressure is also applied to the back of the semiconductor device 2 mounted on the substrate 1 due to the attraction effect of the sheet material 3, it is possible to pressurize, heat, and cure a resin also by a decompressing system instead of the above pressurizing system using air pressure.

Furthermore, on the basis of the sheet material 3, by applying an air pressure of 1 atm to the upper face of the sheet material 3 and a negative pressure of −1 atm due to decompression to the lower face of the sheet material 3 for example, the back of the semiconductor device 2 can obtain a synergism of the total of 2 atm resulting from 1 positive atm and 1 negative atm as the above. Therefore, this is effective when an air pressure is insufficient for pressurizing the semiconductor device 2.

The above embodiment uses the attracting mechanism 4 and vertically moving mechanism 5, and upper chamber 6 as the setting means of an apparatus for fabricating a semiconductor-mounting body of the present invention, the pressurizing port 8 (gas supplying means) and exhaust port B (gas excluding means) as the pressuring means of an apparatus for fabricating a semiconductor-mounting body of the present invention, the attracting mechanism 4 and upper chamber 6 as the fixing means of an apparatus for fabricating a semiconductor-mounting body of the present invention, and the heat source 7 as the heating means of an apparatus for fabricating a semiconductor-mounting body of the present invention.

Moreover, the attracting mechanism 4 (attracting mechanism 4') is used as the looseness removing means of an apparatus for fabricating a semiconductor-mounting body of the present invention.

Furthermore, the heat source 7 of the above embodiment can use any one of a cartridge heater, a ceramic heater, a sheathed heater, a halogen lamp, and a heater using infrared or high frequency.

Second Embodiment

A configuration of the apparatus for fabricating a semiconductor-mounting body of the second embodiment is described by referring to the accompanying drawings. Because the apparatus for fabricating a semiconductor-mounting bodies of the second and first embodiments have many common points, only different points are described for the second embodiment.

Figure 3:
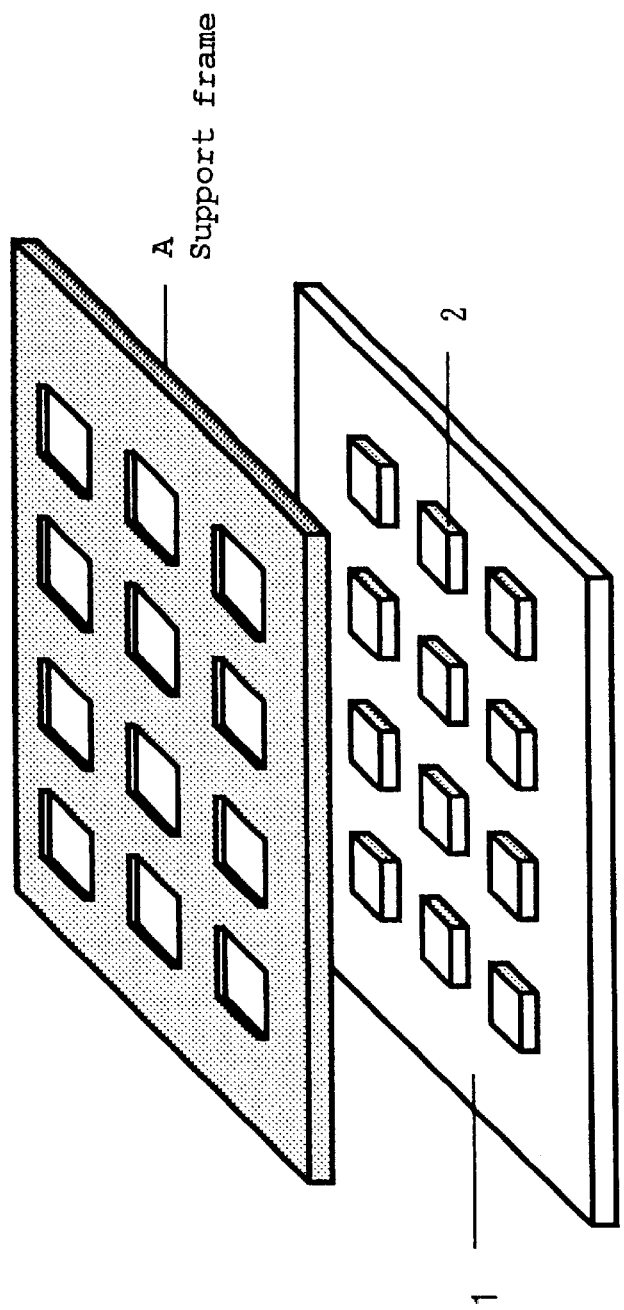
FIG. 3 is a perspective view of the support frame of the second and fourth embodiments of the present invention.
Figure 4:
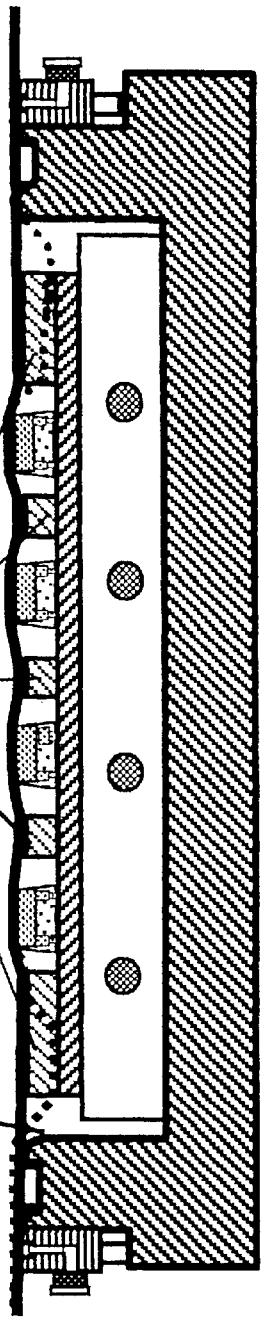
FIG. 4 is an illustration for explaining the method for fabricating a semiconductor-mounting body of the second and fourth embodiments of the present invention.

FIG. 3 is a perspective view showing a general configuration of a support frame A set nearby a semiconductor device 2 before a sheet material 3 is set to the upper face of the semiconductor device 2 and the support frame A supports the sheet material 3. FIG. 4 is an illustration showing a state of setting the support frame A nearby each semiconductor device 2 and then setting the sheet material 3 to upper faces of the semiconductor devices 2, and pressurizing the semiconductor devices 2 by the sheet material 3.

As shown in FIGS. 3 and 4, the thickness of each support frame A is adjusted so that the opening of each support frame A set on the substrate 1 becomes larger than each corresponding semiconductor device 2 and substantially becomes equal to the height of each semiconductor device 2.

By setting the support frames A thus formed on the substrate 1 so that the opening of each support frame A surrounds a corresponding semiconductor device 2, putting the sheet material 3 on the support frames A, and pressurizing them, an excessive tension is transferred to the semiconductor device 2 and the semiconductor device 2 may be damaged or the sheet material 3 may be broken because a force for immobilizing the semiconductor device 2 works on the sheet material 3 as shown by the dotted-line portions "a" in FIG. 4 when the support frames A are not present. However, when the support frames A are set, because a stress concentrated on the semiconductor device 2 works, it is possible to improve the connection reliability between the semiconductor devices 2 in which more-stable pressurizing and heating are maintained.

Figure 5:
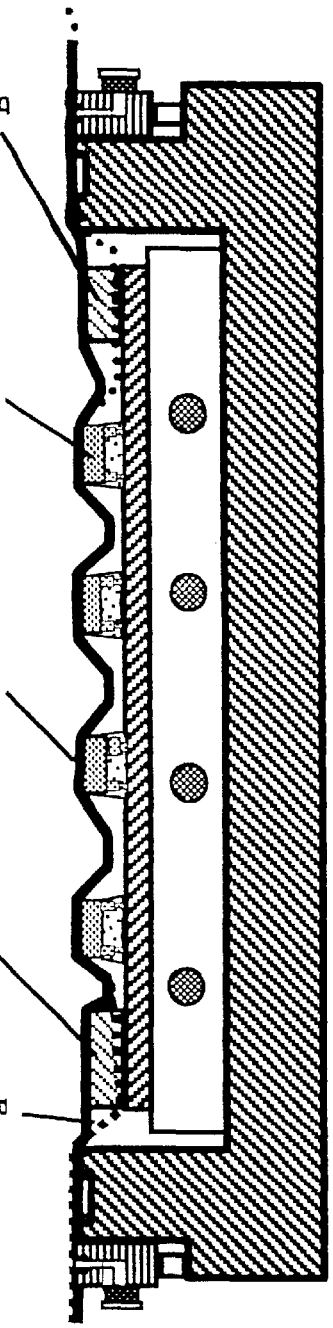
FIG. 5 is an illustration for explaining the method for fabricating a semiconductor-mounting body of the second and fourth embodiments of the present invention.
Figure 12:
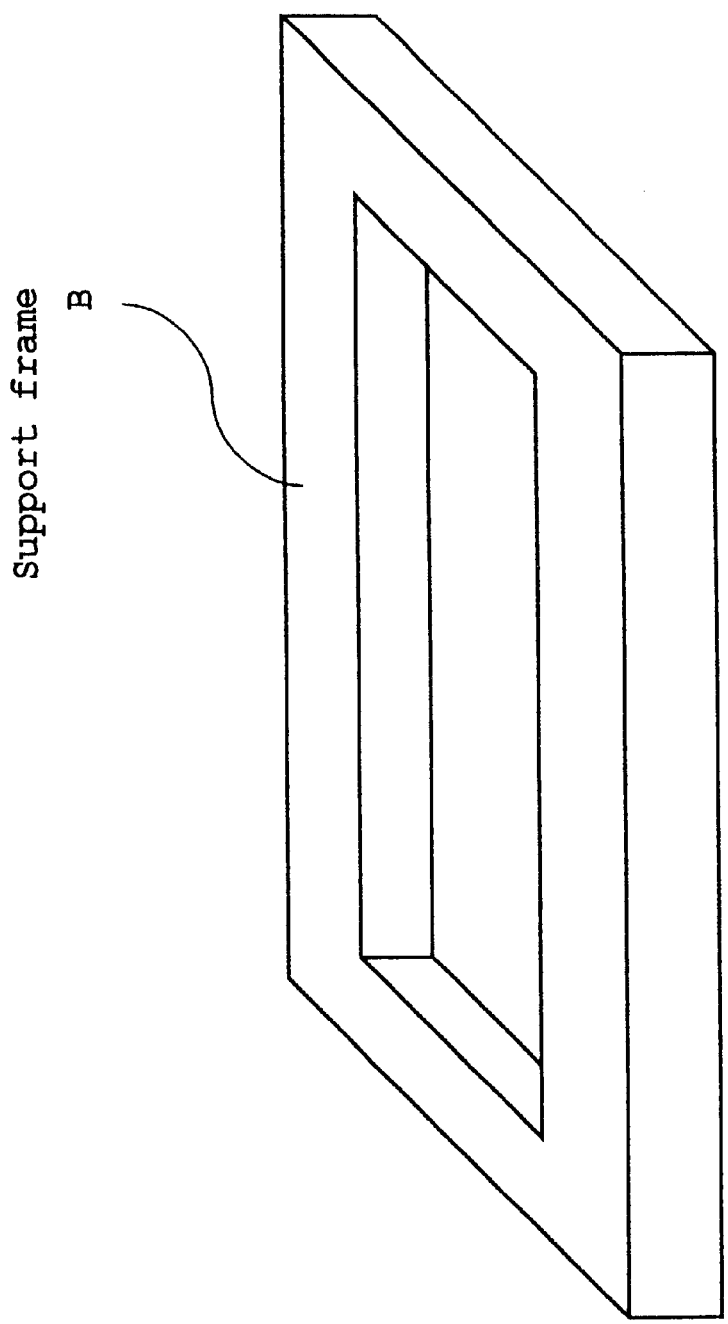
FIG. 12 is a perspective view of the support frame of the second and fourth embodiments of the present invention.

Moreover, even when setting support frames B having openings larger than the entire area of many mounted semiconductor devices 2 shown in FIG. 12 onto the substrate 1 so that the openings surround all the semiconductor devices 2 as shown in FIG. 5, it is possible to pressurize and heat the semiconductor devices 2 while minimizing damages to the semiconductor devices 2 because the tension of the sheet material 3 is moderated by the support frames B.

Third Embodiment

Then, a heating configuration and operations of the apparatus for fabricating a semiconductor-mounting body of the third embodiment are described below by referring to the accompanying drawings. Because apparatus for fabricating a semiconductor-mounting bodies of the third embodiment and the first embodiment have many common points, only different points are described for the third embodiment.

Figure 6:
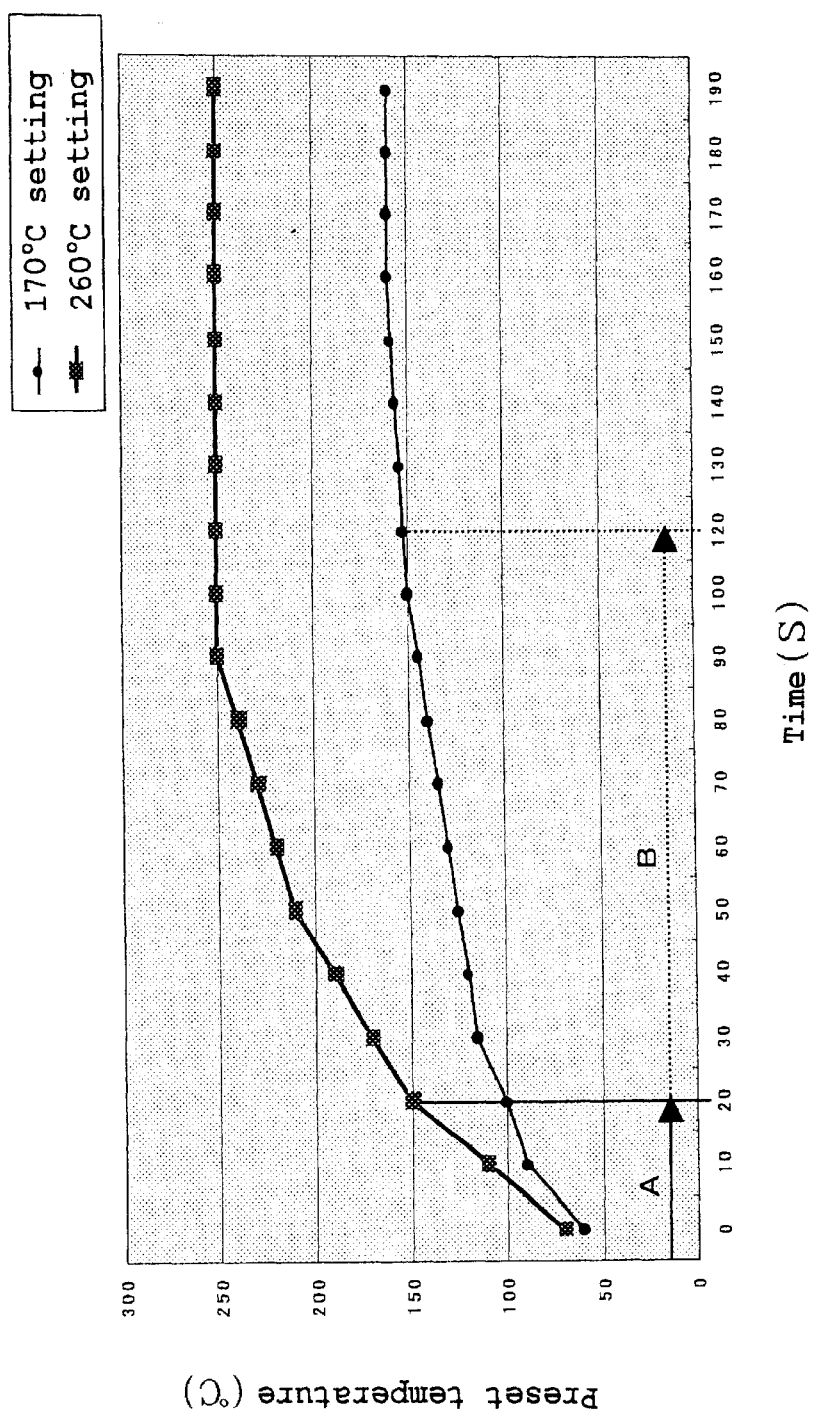
FIG. 6 is an illustration showing a temperature profile showing the relative relation between set temperature and temperature rise rate of the heat source of the apparatus for fabricating a semiconductor-mounting body of the third embodiment of the present invention.

FIG. 6 is a temperature profile showing relative relations between preset temperatures of a heat source 7 and temperature rise rates of a sealing resin 11.

Because the present heating-curing system uses radiant heat, a set temperature and a temperature rise rate of the heat source 7 inevitably have a relative relation. For example, as shown in FIG. 6, when assigning the temperature rise rate of the sealing resin 11 to the abscissa and the temperature of the sealing resin 11 to the ordinate and when the set temperature of the heat source 7 is 170°, the duration until the sealing resin 11 reaches a desired target ultimate temperature (150° to 160°) is approx. 120 sec. In this case, the distance between the heat source 7 and the sheet material 3 is set to 1.0 mm.

However, when the set temperature of the heat source 7 is 260°, the duration until the sealing resin 11 reaches a desired target ultimate temperature (150° to 160°) is approx. 20 sec. As a condition, the temperature of the sealing resin 11 is measured through the sheet material 3 by keeping the distance between the semiconductor device 2 and the heat source 7 constant.

Thus, by setting the temperature of the heat source 7 to a high value (e.g. 260°) and making the heat source 7 approach the sheet material 3, increasing the spatial distance between the sheet material 3 and the heat source 7 while keeping the set temperature of the heat source 7 after the sealing resin 11 reaches a desired target ultimate temperature (150° to 160°), and performing temperature profile control so that the sealing resin 11 keeps a desired set temperature, it is possible to raise the temperature of the sealing resin 11 in a short time, cure the sealing resin 11 in a short time, and greatly decrease the thermally-curing time.

In the case of this embodiment, a vertically-movable air cylinder (not illustrated) is set to the heat source 7 and a cam tilted by a certain angle is set to the front end of the shaft of the air cylinder. Therefore, by changing flow rates of the air cylinder, it is possible to simply operate the cam to an optional position and easily change heights of the heat source 7 from the sheet material 3.

Moreover, to vertically move the above heat source 7, it is allowed to use a stepping motor or a pulse motor having electrical control.

Means of vertically moving the heat source 7 corresponds to the distance-adjusting means of an apparatus for fabricating a semiconductor-mounting body of the present invention, the height-control screw 14 shown in FIG. 2 corresponds to the distance-adjusting means.

Fourth Embodiment

Then, the method for fabricating a semiconductor-mounting body of this embodiment is described below by referring to the accompanying drawings. The fourth embodiment is described by referring to the drawings used for the first embodiment.

FIG. 1 is a sectional view for explaining a general configuration of a method for fabricating a semiconductor-mounting body and FIG. 2 is a detailed illustration of FIG. 1.

As shown in FIGS. 1 and 2, a mounting body having a plurality of semiconductor devices 2 flip-chip-mounted on a substrate 1 is set on a heat source 10 and a sealing resin 11 is set to the gap between the substrate 1 and the semiconductor devices 2. Then, as shown in FIGS. 1 and 2, the sheet material 3 is attracted to the semiconductor devices 2 and a stretch can be kept at a certain pressure by setting a flexibly deformable sheet material 3 to an attracting mechanism 4 in which a concave groove is formed on a frame and then evacuating the exhaust port A. Moreover, because a plurality of concave grooves are formed on the attracting mechanism 4, it is possible to obtain a more stable stretch because the looseness of the sheet material 3 is corrected.

Furthermore, because the vertically moving mechanism 5 including a compression spring and having a vertically-movable function is set to a position separate from the semiconductor devices 2 below the attracting mechanism 4 so that the sheet material 3 is stretched, it is possible to remove attached sealing resin 11 or solve a problem on the semiconductor device 2 when a operator sets the sheet material 3.

Then, by lowering the upper chamber 6 having an integrated structure including the heat source 7, the following operation is also transferred to the vertically moving mechanism 5 due to the weight of the upper chamber 6 and therefore, the sheet material 3 attracted to the attracting mechanism 4 is moved up to the vicinity of the back of the semiconductor device 2.

Then, by supplying air or compressed gas into the upper chamber 6 from the pressurizing port 8 formed on a part of the upper chamber 6 and pressurizing the sheet material 3, the air pressure is transferred to the semiconductor devices 2 through the sheet material 3 as shown in FIG. 2. Therefore, it is possible to press the semiconductor devices 2 having different thicknesses and shapes at a uniform pressure.

Then, by making the heat source 7 built in the chamber 6 approach to the sheet material 3, it is possible to heat and cure the sealing resin 11 because the radiant heat of the heat source 7 is also transferred to the sealing resin 11 set to the semiconductor devices 2 through the sheet material 3 similarly to the above described case.

Thus, because it is possible to simultaneously execute the pressurizing, heating, and curing steps of the sealing resin 11 with radian heat by bringing the heat source 7 into non-contact with the sheet material 3 while pressing the semiconductor devices 2 at a uniform pressure. Therefore, it is possible to greatly improve the productivity and connection reliability.

Moreover, because the gap between the heat source 7 and the semiconductor device 2 is influenced by the temperature dependency with radiant heat, it is possible to simply obtain spatial gap adjustment of radiant heat through fine adjustment of the height-control screw 14 set to the heat source 7.

Furthermore, the sheet material 3 used to heat and cure the sealing resin 11 while applying a constant pressure to the semiconductor devices 2 is a sheet having a rubber sheet formed by silicon or Buna-S at a thickness of 0.01 to 3 mm, a resin sheet material formed by polyimide, fluoro resin, polyphenylene sulfide, polypropylene, polyether, polycarbonate, or chrolosulfonated polyethylene at a thickness of 0.01 to 1 mm, or a metallic sheet material formed by aluminum, copper, or stainless steel at a thickness of 0.01 to 0.5 mm.

Furthermore, by applying a mold-releasing treatment to the side of the sheet material 3 contacting the semiconductor devices 2, it is possible to suppress attachment of the sealing resin 11 and the operation efficiency is improved because cleaning is simplified even if the sealing resin 11 attaches.

Furthermore, by applying a coloring treatment for improving heat absorption to the side of the sheet material 3 not contacting the semiconductor devices 2, it is possible to obtain quick heat absorption characteristic and decrease the heating-curing time of the sealing resin 11.

Furthermore, even if adding a colored additive to the sheet material 3, the same advantage as the above can be obtained.

Furthermore, in the case of the sheet material 3, by applying the above mold releasing treatment and coloring treatment to a compound of a rubber sheet material, a resin sheet material, and a metallic sheet material, the advantage to be described later is obtained. For example, by combining a silicon-rubber sheet material with a metallic sheet material, damages when contacting with the semiconductor devices 2 are suppressed by elastic silicon rubber and moreover, it is possible to prevent the sealing resin 11 from attaching. Moreover, by forming a metallic sheet material having a high rigidity and superior in heat transfer on the side of an elastic body not contacting with the semiconductor devices 2, it is possible to quickly absorb heat. Furthermore, a trace is formed on the metallic sheet material due to a stress of an edged portion of a corner by adding a pressure to the metallic sheet material when the semiconductor device 2 is square or rectangular though there is no problem when the semiconductor device 2 is spherical. However, by constituting the sheet material by a compound of a metallic sheet material and silicon rubber the sheet can be recycled and it is possible to greatly reduce the material cost.

Furthermore, as shown in FIG. 4, by setting the support frame A which has a plurality of openings corresponding to the semiconductor devices 2 mounted on the substrate 1 and whose thickness is adjusted so as to be substantially equal to the height of the semiconductor devices 2 so that each opening of the support frame A surrounds the corresponding semiconductor device 2, a stress for pressing the sheet material 3 is reduced and no excessive tension is not applied to the semiconductor devices 2. Therefore, it is possible to obtain a stable connection reliability.

Furthermore, even when setting a support frame B having an opening larger than the entire region of the mounted semiconductor devices 2 shown in FIG. 12 onto the substrate 1 so that the opening surrounds all the semiconductor devices 2 as shown in FIG. 5, it is possible to minimize damages on the semiconductor devices 2 because the tension of the sheet material 3 is moderated by the support frame B.

Furthermore, even if the semiconductor devices 2 mounted on the substrate 1 is a multichip module having at least two types of shapes or thicknesses, it is possible to simultaneously pressurize, heat, and cure the sealing resin 11 while an equal pressure is applied.

Furthermore, even when electronic components are mounted on the substrate 1 together with the semiconductor devices 2, the same advantage as the above can be obtained.

Fifth Embodiment

Then, the method for fabricating a semiconductor-mounting body of the fifth embodiment is described below by referring to the accompanying drawings.

Figure 7:
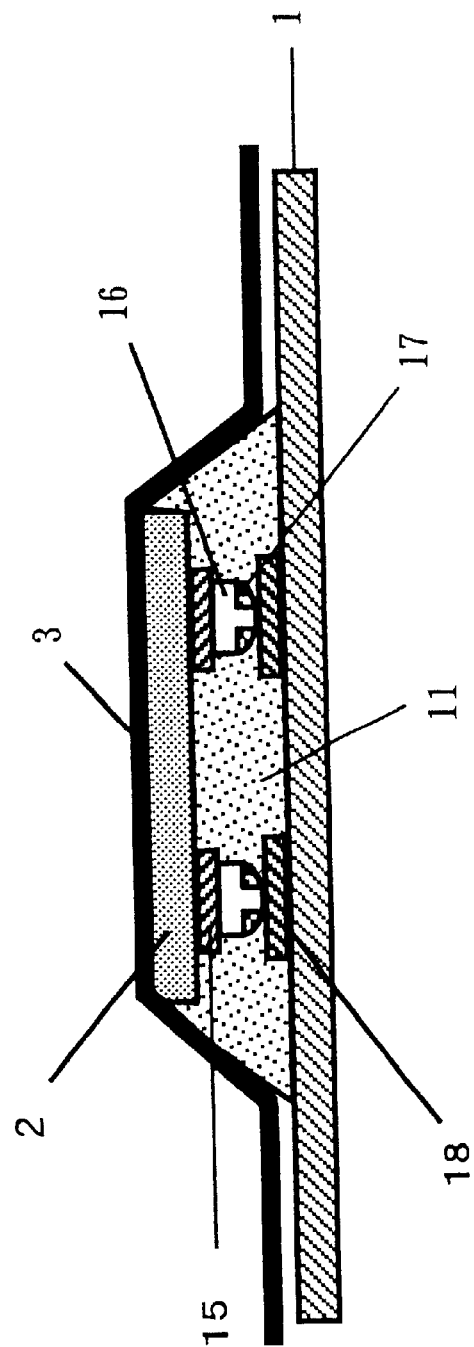
FIG. 7 is an illustration for explaining the method for fabricating a semiconductor-mounting body of the fifth embodiment of the present invention according to the SBB method.
Figure 8:
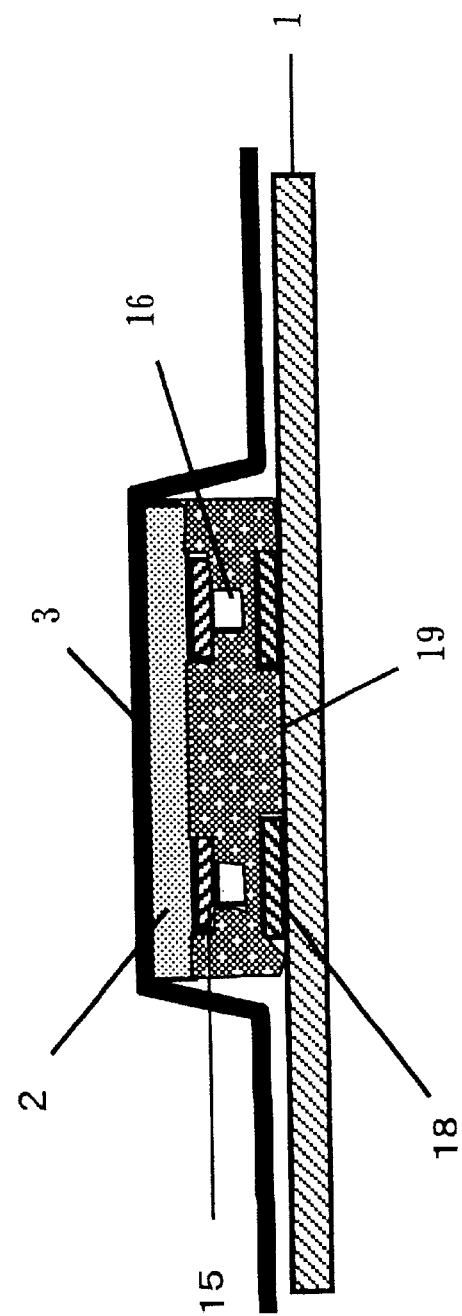
FIG. 8 is an illustration for explaining the method for fabricating a semiconductor-mounting body of the fifth embodiment of the present invention when using a paste-like or sheet-like sealing material.
Figure 9:
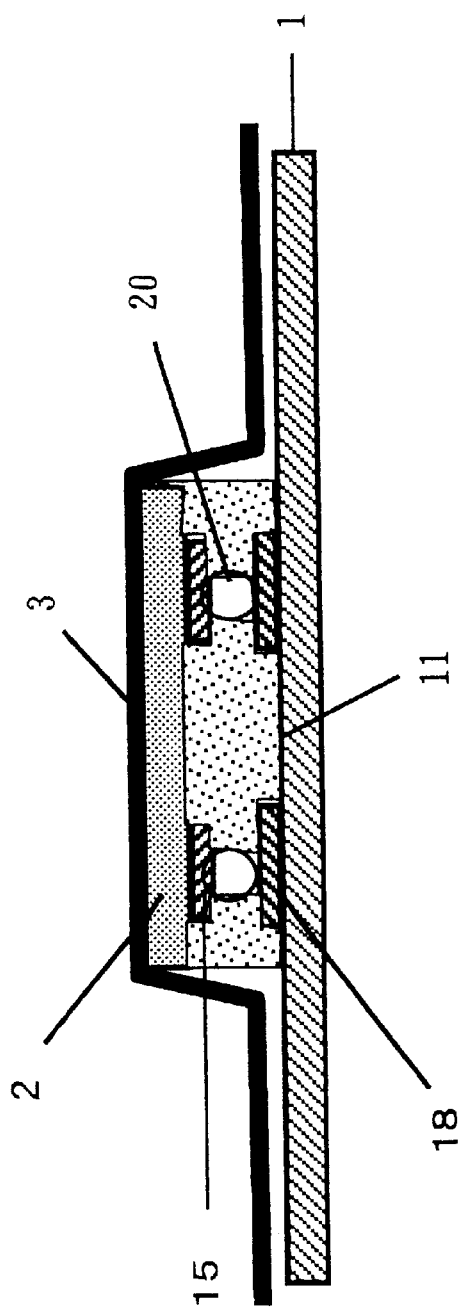
FIG. 9 is an illustration for explaining the method for fabricating a semiconductor-mounting body of the fifth embodiment of the present invention when forming a solder- or gold-plated bump on an electrode pad of a semiconductor device.
Figure 10:
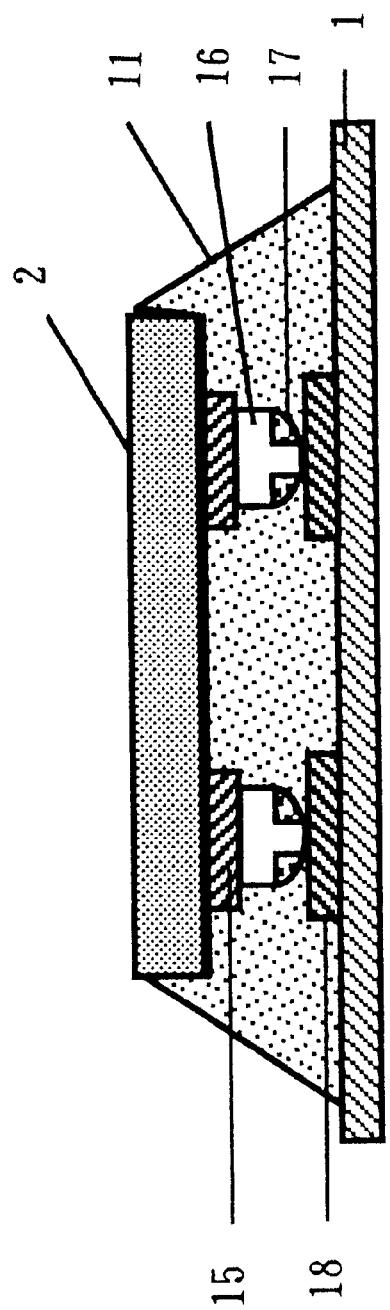
FIG. 10 is an illustration for explaining the configuration and a structure in which a semiconductor device is flip-chip-mounted on a substrate by using a conventional apparatus for fabricating a semiconductor-mounting body and the structure fabrication procedure.
Figure 11:
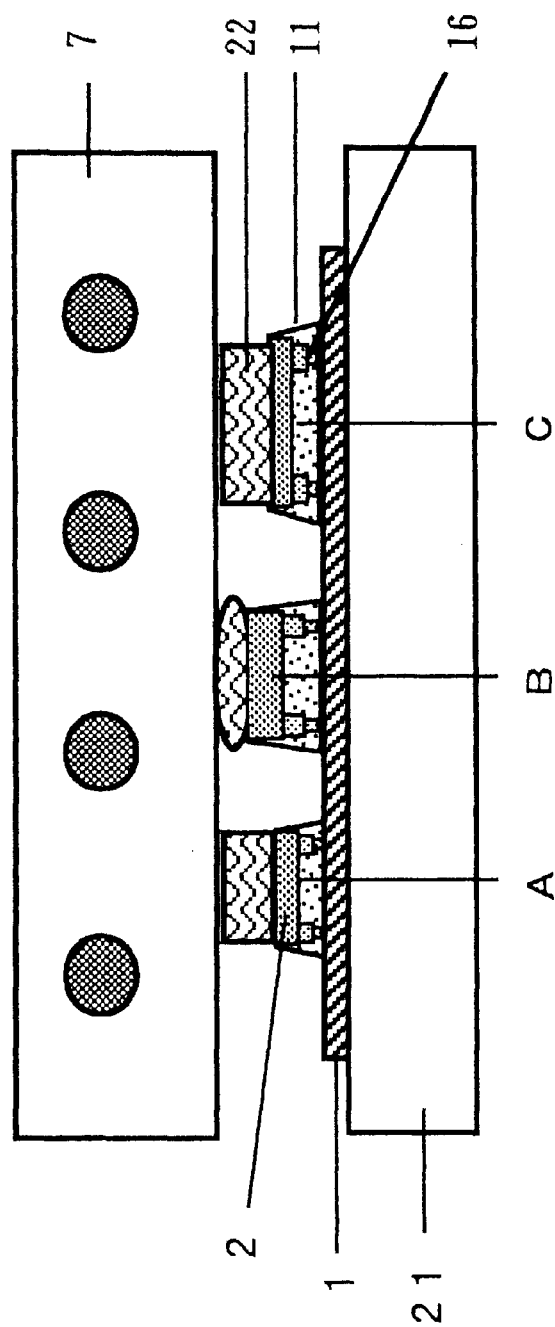
FIG. 11 is an illustration showing a state of flip-chip-mounting a semiconductor device on a substrate by using an elastic body when fabricating a semiconductor-mounting body by a conventional apparatus for fabricating a semiconductor-mounting body.

FIG. 7 is a sectional view showing a step when a method for fabricating a semiconductor-mounting body uses an SBB method (stud bump bonding), FIG. 8 is a sectional view showing a fabrication process for fabricating a semiconductor-mounting body by using paste-like or sheet-like sealing material, and FIG. 9 is a sectional view showing a method for fabricating a semiconductor-mounting body using a semiconductor device in which a solder- or gold-plated bump is formed on an electrode pad.

As shown in FIG. 7, it is possible to set a flexibly deformable sheet material 3 on the upper face of the semiconductor device 2 and simultaneously heat and cure a sealing resin 11 while heating the back of the semiconductor devices 2 as described above also in the case of the SBB mounting method comprising a step of forming a bump 16 on an electrode pad 15 of a semiconductor device 2, a step of transferring a conductive adhesive 17 to the bump 16, a step of flip-chip-mounting the semiconductor device 2 on a terminal electrode 18 of a substrate 1, a step of drying the conductive adhesive 17, and a step of injecting a sealing resin 11 into the gap between the semiconductor device 2 and the substrate 1.

Moreover, because the bump 16 and terminal electrode 18 are securely joined with each other in accordance with the pressurizing effect through a sheet material 3, the necessity of uniformly transferring a controlled quantity of the conductive adhesive 17 to the whole of the bump 16 having a two-stage protruded shape is eliminated, a step of controlling a quantity of the conductive adhesive 17 to be transferred can be omitted, the quantity of the conductive adhesive 17 can be suppressed, and attachment of the conductive adhesive 17 to the adjacent bump 16 is suppressed. Therefore, it is possible to effectively apply the method for fabricating a semiconductor-mounting body described for the first embodiment, etc. to the semiconductor device 2 having a small pitch of 80 µm or less.

Furthermore, as shown in FIG. 8, it is possible to simultaneously heat and full-scale-cure a sealing material while pressurizing backs of a plurality of semiconductor devices 2 by a flexibly deformable sheet material 3 after temporarily curing the sealing material under pressurized and heated state when mounting the semiconductor devices 2 also in the case of a method for fabricating a semiconductor-mounting body comprising a step of forming a bump on an electrode pad 15 and a step of applying a paste-like sealing material 19 onto a substrate 1 or attaching a sheet-like sealing material onto the substrate 1. Therefore, it is possible to decrease the mounting time and improve the productivity.

Furthermore, as shown in FIG. 9, simultaneous treatment same as the above described can be made by pressurizing the back of the semiconductor device 2 by a sheet material 3, and melting a solder bump 20 after executing a step of forming the solder bump 20 on an electrode pad 15 of a semiconductor device 2.

Furthermore, it is possible to obtain the same advantage as described above by executing a step of forming a gold-plated bump on an electrode pad 15 of a semiconductor device 2 and then, pressurizing the back of the semiconductor device 2 by a sheet material 3 and thermally contact-bonding the bump to the back.

As described above, the present invention can provide a method for fabricating a semiconductor-mounting body and an apparatus for fabricating a semiconductor-mounting body capable of fabricating a semiconductor-mounting body substantially uniformly pressurizing a plurality of semiconductor devices having different thicknesses and shaped when mounting the semiconductor devices on a substrate.

What is claimed is:

1. An apparatus for fabricating a semiconductor-mounting body having a plurality of semiconductor devices mounted on a substrate and a sealing resin set in a gap between the substrate and the semiconductor device, comprising:

setting means of setting a flexibly deformable sheet on a face of the plurality of semiconductor devices not facing the substrate, at least two of the semiconductor devices being of different heights; and pressurizing means of generating an air-pressure difference between a first side of the sheet where the semiconductor device is not present and a second side of the sheet where the semiconductor device is present so that the air pressure at the first side becomes higher than the air pressure at the second side, the sheet being pressurized towards the plurality of semiconductor devices only through the air-pressure difference generated by the pressurizing means, wherein the fabricating apparatus is free of other means of pressurizing the semiconductor devices.

2. The apparatus for fabricating a semiconductor-mounting body according to claim 1, wherein at least a part of the sheet does not contact the substrate when the sheet is pressurized towards the plurality of semiconductor devices.

3. The apparatus for fabricating a semiconductor-mounting body according to claim 1 or 2, wherein the pressurizing means supplies pressure to the first side of the sheet where the semiconductor device is not present and excludes pressure from the second side of the sheet where the semiconductor device is present.

4. The apparatus for fabricating a semiconductor-mounting body according to claim 1 or 2, wherein the sheet is not in contact with the semiconductor device and/or the sealing resin at least immediately before the sheet is pressurized towards the plurality of semiconductor devices.

5. The apparatus for fabricating a semiconductor-mounting body according to claim 1 or 2, further comprising fixing means of fixing the circumference of the sheet to the semiconductor device at least immediately before the sheet is pressurized towards the plurality of semiconductor devices.

6. The apparatus for fabricating a semiconductor-mounting body according to claim 5, further comprising looseness removing means of removing looseness from the sheet before pressurizing the sheet towards the plurality of semiconductor devices.

7. The apparatus for fabricating a semiconductor-mounting body according to claim 6, wherein looseness is removed from the sheet by fixing the circumference of the sheet in order from the outside to the inside of the sheet.

8. The apparatus for fabricating a semiconductor-mounting body according to claim 1 or 2, further comprising heating means of heating the sheet from the first side where the semiconductor device is not present when the sheet is pressurized towards the plurality of semiconductor devices.

9. The apparatus for fabricating a semiconductor-mounting body according to claim 8, further comprising distance adjusting means of adjusting the distance between the sheet and the heating means.

10. The apparatus for fabricating a semiconductor-mounting body according to claim 1 or 2, wherein the sheet is a rubber sheet formed by silicon or Buna-S and having a thickness of 0.01 to 3 mm.

11. The apparatus for fabricating a semiconductor-mounting body according to claim 1 or 2, wherein the sheet is a resin sheet formed by any one of polyimide, fluoro resin, polyphenylene sulfide, polypropylene, polyether, polycarbonate, and chrolosulfonated polyethylene, or a compound of them and having a thickness of 0.01 to 1 mm.

12. An apparatus for fabricating a semiconductor-mounting body having at least one semiconductor device mounted on a substrate and a sealing resin set in the gap between the substrate and the semiconductor device, comprising:

setting means of setting a flexibly deformable sheet on a face of the semiconductor device not facing the substrate; and pressurizing means of generating an air-pressure difference between the side where the semiconductor device is not present and the side where the semiconductor device is present so that the air pressure at the side where the semiconductor device is not present becomes higher than the side where the semiconductor device is present on the basis of the sheet and pressurizing the semiconductor device by the sheet, wherein the sheet is a metallic sheet formed by aluminum, copper, or stainless steel and having a thickness of 0.01 to 0.5 mm.

13. The for fabricating a semiconductor-mounting body according to claim 1 or 2, wherein a mold-releasing treatment is applied to the second side of the sheet.

14. The apparatus for fabricating a semiconductor-mounting body according to claim 1 or 2, wherein a coloring treatment for improving heat absorption is applied to the first side of the sheet.

15. The apparatus for fabricating a semiconductor-mounting body according to claim 1 or 2, wherein a colored additive for improving heat absorption is contained in the sheet.

16. The apparatus for fabricating a semiconductor-mounting body according to claim 1 or 2, further comprising a support frame to be set to support the sheet nearby the semiconductor device before at least a portion of the sheet is fixed to the semiconductor device.

* * * * *